(12) United States Patent
Lee et al.

(10) Patent No.: US 6,320,019 B1
(45) Date of Patent: Nov. 20, 2001

(54) METHOD FOR THE PREPARATION OF POLYAMIC ACID AND POLYIMIDE

(75) Inventors: Kyung Rok Lee; Soon Sik Kim; Kyeong Ho Chang, all of Seoul; Jeong Min Kweon, Kyunggi-Do, all of (KR)

(73) Assignee: Saehan Industries Incorporation, Kyongsangbuk-Do (KR)

( * ) Notice: Subject to any disclaimer, the term of this patent is extended or adjusted under 35 U.S.C. 154(b) by 0 days.

(21) Appl. No.: 09/512,382

(22) Filed: Feb. 25, 2000

(51) Int. Cl.[7] ............... C08G 69/26; C08G 69/28; C08G 73/10
(52) U.S. Cl. ............... 528/353; 528/10; 528/26; 528/35; 528/38; 528/125; 528/126; 528/128; 528/170; 528/171; 528/172; 528/173; 528/176; 528/183; 528/188; 528/220; 528/229; 528/350
(58) Field of Search ............... 528/10, 26, 35, 528/38, 125, 126, 128, 171, 172, 173, 176, 183, 188, 220, 229, 350, 353, 170

(56) References Cited

U.S. PATENT DOCUMENTS

| | | | |
|---|---|---|---|
| 4,960,846 | * 10/1990 | Burgess et al. | 528/26 |
| 5,104,946 | * 4/1992 | Lee | 528/172 |
| 5,231,162 | * 7/1993 | Nagata | 528/353 |
| 5,406,124 | * 4/1995 | Morita et al. | 428/473.5 |
| 6,077,924 | * 6/2000 | Chiang et al. | 528/172 |
| 6,096,850 | * 8/2000 | Chiang et al. | 528/172 |
| 6,132,865 | * 10/2000 | Oka et al. | 528/353 |

* cited by examiner

*Primary Examiner*—P. Hampton-Hightower
(74) *Attorney, Agent, or Firm*—Harrison & Egbert

(57) ABSTRACT

A method for preparing polyamic acid and polyimide of three-dimensional molecular structure such that these polymers are superior in adhesive strength and high-temperature stability while maintaining their inherent thermal resistance and mechanical properties, and thus can be effectively used as an adhesive material for high temperature adhesive tapes suitable for semiconductor assembly. The polyamic acid is prepared by reacting at least one tetracarboxylic dianhydride, at least one aromatic diamine, at least one diamine with a siloxane structure, represented by the following general formula I, and at least one polyamino compound represented by the following general formula II or III:

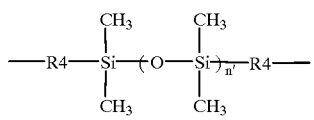

(I)

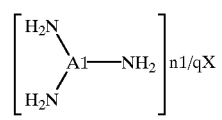

(II)

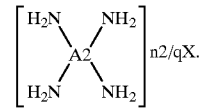

(III)

5 Claims, No Drawings

METHOD FOR THE PREPARATION OF POLYAMIC ACID AND POLYIMIDE

TECHNICAL FIELD

The present invention relates to a method for preparing polyamic acid, a precursor of polyimide, which is superior in thermal resistance and high-temperature adhesive properties and polyimide and, more particularly, to a method for preparing three-dimensional molecular structures of polyamic acid and polyimide.

BACKGROUND ART

Typically, polyimide is prepared through the thermal or chemical imidization of polyamic acid, a precursor of polyimide, which can be obtained by reacting dianhydride with diamine in an organic solvent.

Because of its excellent in thermal resistance, chemical resistance, electrical insulation, and mechanical properties, polyimide resins find numerous applications in the electric and electronic appliance, adhesive, composite material, fiber, and film industries.

By virtue of its linear backbone structure which allows chains to be packed at a high density as well as the rigidity of the imide ring itself, polyimide can show superior thermal resistance. Particularly, the polyimide which is specialized to be used in areas where high temperature stability is required, such as in the production of films, has a linear backbone structure such that the packing density of polymer chains is high, largely determining the thermal resistance of the polyimide. Commercially available polyimide films, exemplified by Kapton and Upilex, typically exhibit such structures. Kapton is known to be prepared from pyromellitic dianhydride (PMDA) and oxydianiline (ODA) monomers while Upilex can be prepared from 3,3',4,4'-biphenyltetracarboxylic acid dianhydride (BPDA) and para-phenylenediamine (PPD) monomers.

No mater how improved it is, the thermal resistance of such linear structures falls within the scope of the conventional polyimide films. An increase in molecular weight of a polyimide film with the aim of improving its thermal properties results in deteriorating its mechanical properties such as flexibility. Various attempts have been made to improve the thermal resistance of polyimide.

For example, Japanese Pat. No. 63-254131 recruits PPD into the polyimide structure prepared from PMDA and ODA, such as Kapton. However, the resulting film suffers from a disadvantage of being poorer in mechanical strength as the content of PPD is higher. In addition, there is found to exist a limit of increasing only the thermal resistance without deteriorating the mechanical properties.

Another technique to overcome the problems that linear structures of polyimide have can be referred to U.S. Pat. No. 5,231,162 in which tri- or tetra-amine is introduced into aromatic diamine with the aim of converting the linear structure into a three-dimensional molecular structure through gelation, whereby both the thermal properties and the mechanical properties can be improved. Resulting from the use of aromatic tetracarboxylic dianhydride and aromatic diamine only, a deficiency in flexibility is found in the film. In addition, the gelation causes the polyamic acid and the polyimide to decrease in solubility, thus making the processability of the resins poor.

With respect to the polyamic acid or polyimide which is used as an adhesive material, its adhesiveness at high temperatures is dependent on the flowability at such temperatures. Introduction of ether into the main chain of the polymer brings about a decrease in its glass transition temperature, thus enabling an improvement in the high-temperature adhesiveness, but a decrease in its thermal resistance, as well, thus making the reliability poor for a process which is carried out with the adhesive.

U.S. Pat. Nos. 4,847,349 and 5,406,124, disclose thermoplastic adhesives based on the diamine containing two or more ether groups which are introduced among three or four phenyl rings. The adhesives show an improvement in high-temperature flowability, but suffer from a disadvantage of being lower in thermal resistance.

SUMMARY OF THE INVENTION

Therefore, it is an object of the present invention to overcome the above problems encountered in the prior art and to provide a method for preparing polyamic acid and polyimide, which both have such three-dimensional molecular structures that a significant improvement can be brought about in the flowability at high temperatures while guaranteeing the thermal resistance and mechanical properties inherent to the polymers, thereby making the polymers suitable for use in thermal resistance film and high temperature adhesives.

Based on the present invention, the above object could be accomplished by a provision of a method for preparing polyamic acid and polyimide, which comprises reacting a mixture containing: at least one tetracarboxylic dianhydride; at least one aromatic diamine; at least one diamine with a siloxane structure, represented by the following general formula I:

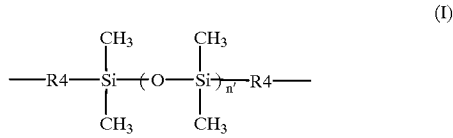

wherein R4 is an alkylene group containing 1–20 carbon atoms and n' is the number of a recurring unit from 1 to 20; and at least one polyamino compound represented by the following general formula II or III:

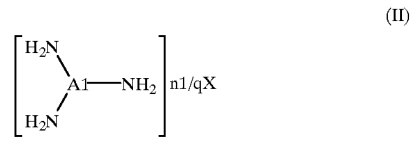

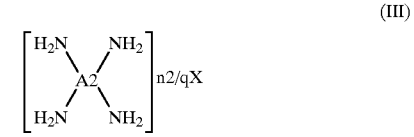

wherein A1 is selected from the group consisting of:

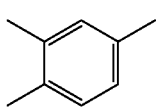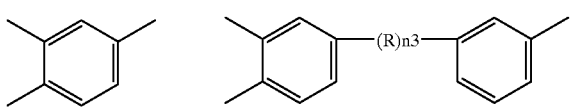

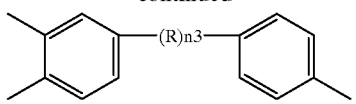

A2 is selected from the group consisting of:

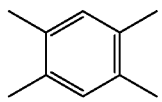 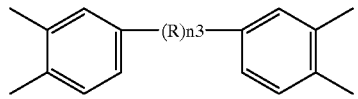

wherein R represents —O—, —CH$_2$—, —CO—, or —SO$_2$—;
n1 is an integer of 0 to 4; n2 is an integer of 0 to 3; x represents an acid; and q is the base number of the acid.

DETAILED DESCRIPTION OF THE INVENTION

To have advantages over a linear molecular structure of polyimide in terms of physical properties, including thermal resistance, mechanical properties, adhesive properties and the like, a three-dimensional molecular structure of polyamic acid or polyimide is prepared by employing a siloxane structure of diamine and a compound having a polyfunctional amino group such as a tri- or a tetra-amino group, along with conventionally used aromatic diamine. According to the content of the polyfunctional amino group, desired properties of the polyamic acid or polyimide can be obtained.

As typical examples, the tetracarboxylic dianhydride useful in the present invention is referred to compounds of the following general formula IV:

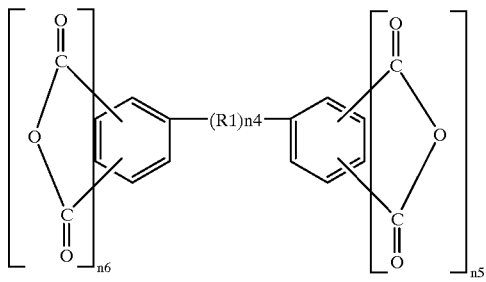

Wherein R1 represents —O—, —CO—, —SO$_2$—, —C(CF$_3$)$_2$—, an alkylene group, an alkylene bicarbonyl group, a phenylene group, a phenylene alkylene group, or a phenylene dialkylene group; n4 is 0 or 1; and n5 is 0 or 1 and n6 is 1 or 2 under the condition that n5+n6=2.

Concrete examples of the aromatic tetracarboxylic dianhydrides of the general formula IV include pyromellitic dianhydride, 3,3',4,4'-benzophenonetetracarboxylic dianhydride, 3,3',4,4'-biphenyltetracarboxylic dianhydride, 2,3,3',4'-biphenyltetracarboxylic dianhydride, 2,2',6,6'-biphenyltetracarboxylic dianhydride, 2,3,6,7-naphthalenetetracarboxylic dianhydride, 1,2,5,6-naphthalenetetracarboxylic dianhydride, 2,2-bis(3,4-dicarboxyphenyl)propane dianhydride, bis(3,4-dicarboxyphenyl)sulfone dianhydride, bis(3,4-dicarboxyphenyl)ether dianhydride, 3,4,9,10-phenylenetetracarboxylic dianhydride, naphthalene-1,2,4,5-tetracarboxylic dianhydride, naphthalene-,1,4,5,8-tetracarboxylic dianhydride, benzene-1,2,3,4-tetracarboxylic dianhydride, and ethylene glycol bis (anhydromellitate). These compounds may be used alone or in combinations.

In addition to the above-mentioned aromatic tetracarboxylic dianhydride, aliphatic or alicyclic structures of tetracarboxylic acid may be used within such a range that the polyamic acid or polyimide to be synthesized would not deteriorated in thermal resistance.

Examples of such aliphatic or alicyclic structures of tetracarboxylic acid include 5-(2,5-diorthotetrahydrol)-3methyl-3-cyclohexane-1,2-dicarboxylic anhdride, 4-(2,5-diorthotetrahydrofuran-3-yl)tetralin-1,2-dicarboxylic anhydride, but-cyclo(2,2,2)-7-en-2,3,5,6-tetracarboxy dianhydride, and 1,2,3,4-cyclopentane tetracarboxy dianhydride and these compounds may be used alone or in combinations.

Concrete examples of the aromatic diamine useful in the present invention include 3,3'-diaminobiphenyl, 3,4'-diaminobiphenyl, 4,4'-diaminobiphenyl, 3,3'diaminodiphenylmethane, 3,4'diaminodiphenylmethane, 4,4'-diaminodiphenylmethane, 2,2-(3,3'-diaminodiphenyl) propane, 2,2-(3,4'-diaminodiphenyl)propane, 2,2-(4,4'-diaminodiphenyl)propane, 2,2-(3,3'-diaminodiphenyl) hexafluoropropane, 2,2-(3,4'-diaminodiphenyl) hexafluoropropane, 2,2-(4,4'-diaminodiphenyl) hexafluoropropane, 3,3'-oxydianiline, 3,4'-oxydianiline, 4,4'-oxydianiline, 3,3'-diaminodiphenylsulfide, 3,4'-diaminodiphenylsulfone, 4,4'-diaminodiphenylsulfone, 1,3-bis[1-(3-aminophenyl)-1-mehylamine]benzene, 1,3-bis[1-(4-aminophenyl)-1-methylamine]benzene, 1,4-bis[1-(3-aminophenyl)-1-methylamine]benzene, 1,4-bis[1-(4-aminophenyl)-1-methylamine]benzene, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 3,3'-bis(3-aminophenoxy) diphenylether, 3,3'-bis(4-aminophenoxy)diphenylether, 3,4'-bis(3-aminophenoxy)diphenylether, 3,4'-bis(4-aminophenoxy)diphenylether, 4,4'-bis(3-aminophenoxy) diphenylether, 4,4'-bis(4-aminophenoxy)diphenylether, 3,3'-bis(3-aminophenoxy)biphenyl, 3,3'-bis(4-aminophenoxy) biphenyl, 3,4'-bis(3-aminophenoxy)biphenyl, 3,4'-bis(4-aminophenoxy)biphenyl, 3,3'-bis(3-aminophenoxy) biphenyl, 4,4'-bis(4-aminophenoxy)biphenyl, 2,2-bis[4-(3-aminophenoxy)phenyl]sulfone, 2,2-bis[4-(4-aminophenoxy)phenyl]sulfone, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]hexafluoropropane, 2,2-bis[4-(4-aminophenoxy)phenyl]hexafluoropropane, 9,9-bis(3-aminophenyl)fluorine, 9,9-bis(4-aminophenyl)fluorine, 3,3'-dimethyl-4,4'-diaminobiphenyl, 2,2'-bis(trifluoromethyl) benzidine, 1,2-phenylenediamine, 1,3-phenylenediamine, and 1,4-phenylenediamine. The above-mentioned compounds may be used, singly or as a mixture of at least two species.

As for the polyfunctional polyamino compounds represented by the general formulas II and III, they are exemplified by 3,3',4,4'-tetraaminodiphenyl ether, 3,3',4,4'-tetraaminodiphenylmethane, 3,3',4,4'-tetraaminobenzophenone, 3,3',4,4'-tetraaminodiphenylsulfone, 3,3',4,4'-tetraaminobiphenyl, 1,2,4,5-tetraaminobenzene, 3,3'4-triaminodiphenyl, 3,3'4-triaminodiphenylmethane, 3,3',4-triaminobenzophenone, 3,3',4-triamiondiphenylsulfone, 3,3',4-triaminodibiphenyl, 1,2,4-triaminobenzene, and the mono-, di-, tri-, and tetra-acid salts of the above compounds, such as 3,3',4,4'-tetraaminodiphenyl ether tetrahydrochloride, 3,3',4,4'-tetraaminodiphenylmethane tetrahydrochloride, 3,3'4,4'-tetraaminobenzophenone tetrahydrochloride, 3,3',4,4'-tetraaminodiphenylsulfone tetrahydrochloride, 3,3',4,4'-tetraaminobiphenyl tetrahydrochloride, 1,2,4,5-tetraaminobenzene tetrahydrochloride, 3,3'4-triaminodiphenyl trihydrochloride, 3,3'4-triaminodiphenylmethane trihydrochloride, 3,3',4-triaminobenzophenone trihydrochloride, 3,3',4-triamiondiphenylsulfone trihydrochloride, 3,3',4-triaminodibiphenyl trihydrochloride, and 1,2,4-triaminobenzene dihydrochloride. These compounds may be used, singly or in mixtures thereof.

Diamines with a siloxane structure represented by the general formula I may be exemplified by bis(-aminopropyl)tetramethyldisiloxane (GAPD, n=1), bis(-aminopropyl)polydimethyldisiloxane (PSX-4, n=4) and bis(-aminopropyl)polydimethyldisiloxane (PSX-8, n=8) and these compounds may be used singly or as a mixture of at least two species.

Contrasting the flexibility deficiency which appears on the three-dimensional network molecular structure of polyimide formed through gelation, the siloxane structure of diamine used in the present invention acts to prevent the three-dimensional molecular structure of polyimide from deteriorating in mechanical properties. In addition to providing such flexibility to the rigid structure of polyimide, the siloxane structure contributes to the solubilization of solvents to increase the content of reactants in organic solvents. Where the polymer is used as an adhesive material, the siloxane structure of diamine also ameliorates the adhesive properties thereof on various substrates, especially in electronic areas, such as silicon chips, insulating layers on chips, lead frames, etc.

Available solvents for the synthesis of polyimide from aromatic tetracarboxylic dianhydride and diamine are aprotic polar solvents such an N-methyl-2-pyrrolidone (NMP), N,N-dimethyl formamide (DMF), N,N-dimethylacetamide (DMAc), dimethylsulfoxide (DMSO), sulforan, hexamethylphosphate triamide, and 1,3-dimethyl-2-imidazolidone, and phenolic solvents such as phenol, cresol, xylphenol, and p-chlorophenol. If necessary, ethereal solvents such as diethylene glycol and dimethyl ether, and aromatic solvents such as benzene, toluene and xylene may be used for the synthesis of polyimide from aromatic tetracarboxylic dianhydride and diamine. Also, other available solvents are methylethyl ketone, acetone, tetrahydrofuran, dioxnane, monoglyme, diglyme, methylcellosolve, cellosolveacetate, methanol, ethanol, isopropanol, methylene chloride, chloroform, trichloroethylene, and nitrobenzene. These solvents may be used alone or as a mixture thereof.

A thermal imidization process, typical of the synthesis of polyimide, comprises coating a solution of a polyamic acid, a precursor of polyimide and subjecting the coating to thermal treatment. For this, the precursor polyamic acid is prepared first. A mixture of at least one tetracarboxylic dianhydride of the general formula IV, at least one aromatic diamine, at least one siloxane structure of diamine of the general formula I, and at least one tri- or tetra-amine of the general formula II or III is allowed to undergo reaction in a nitrogen atmosphere at a temperature of not more than 100° C. with vigorous stirring to give the precursor polyamic acid. Preferably, the reaction is continued for 10 hours, and more preferably 5 hours.

Conversion of the polyamic acid to a polyimide can be achieved by coating the polyamic acid and heating it up to a temperature of 250–500° C. To enhance the imidization during the drying of the coating, a tertiary amine, such as pyridine, triethyl amine, tributyl amine, and isoquinoline, an acid anhydride such as acetic anhydride, propionic anhydride and benzoic anhydride, a dehydrating and ring-closing agent, and/or a ring closing catalyst may be added to a solution of the polyamic acid.

As mentioned earlier, a chemical imidization process may be fulfilled to convert polyamic acid into polyimide. When the polyimide from tetracarboxylic acid-2-anhydride and diamine is soluble in organic solutions, a solution of the polyamic acid from the reactants is directly heated at greater than 100° C. and preferably at greater than 180° C., if necessary, in the presence of a catalyst (at an amount of 25 parts by weight based on the weight of the total reaction) selected from the group consisting of tributyl amine, triethyl amine, triphenyl phosphite, isoquinoline, and pyridine or in the presence of a dehydrating catalyst (at an amount of 25 parts by weight based on the weight of the total reaction) such as p-toluene sulfonic acid, to afford polyimide. Alternatively, tetracarboxylic acid-2-anhydride and diamine are reacted at less than 100° C. in an organic solvent to yield polyamic acid, followed by subjecting the polyamic acid to ring closure at a relatively low temperature from room temperature to 100° C. in the presence of a dehydrating and ring-closing agent selected from acid anhydrides, such as acetic anhydride, propionic anhydride and benzoic anhydride, and carbodiimide compounds, such as dicyclohexylcarbodiimide, optionally along with a ring closing catalyst such as pyridine, isoquinoline, imidazole and triethylemine. Both of the dehydrating and ring-closing agent and the ring closing catalyst is used in two to ten times as large in moles as the tetracarboxylic acid-2-anhydride.

Upon the synthesis of polyimide, better reaction can be obtained with a restrained amount for each component used. For example, based on 100 moles of the tetracarboxylic dianhydride, the aromatic diamine is preferably added at an amount of 10–100 moles and more preferably 60–100 moles. A preferable amount of the diamine compound with a siloxane structure is within a range of 0.1 to 90 moles and more preferably 0.1 to 40 moles. The polyamino compound is preferably added at an amount of 0.01 to 20 moles and more preferably 0.01 to 7 moles. In addition, the tetracarboxylic dianhydride and the amine compounds, which take part in the reaction, are preferably used satisfying the following equivalent condition:

$$0.95 \leq \text{equiv. of TCDA/total equiv. of amines} \leq 1.05$$

(TCDA: tetracarboxylic dianhydride)

Thus, the polyimide prepared according to the present invention is superior in electrical insulation and thermal resistance, and can be applied for adhesive tapes for electronic parts, with which taping can be conducted even at high temperatures by virtue of its capacity of thermo—melting—bonding.

Adhesive tapes for electronic parts are mostly used to form bonds between semiconductor assemblies along the lead frame and at its vicinities, for example, lead pins, paddles to mount semiconductor chips, heat sinks, semiconductor chips, etc. They also, can be used where a large adhesive strength with thin copper films is required, like bilayer adhesive tapes for a flexible printed circuit (FPC) substrate of structures and for tape automated bonding (TAB). As examples of adhesive tapes for use in electronic parts, there are adhesive tapes for fixing lead frames, adhesive tapes for bonding between lead frames and semiconductor chips, and adhesive tapes for use in lead frame die pads. As a rule, such adhesive tapes are required to have good processability upon taping so as to guarantee the stability during semiconductor assembling processes subsequent to the taping and the semiconductor package reliability.

A polyimide adhesive tape may be prepared by applying the polyimide of the present invention on one surface or both surfaces of a base film. In this regard, a solution of a polyimide-based adhesive is coated on one surface or both surfaces of a base film at such a thickness that the final adhesive polymer layer usually ranges in thickness from 1 to 50μ and preferably 5 to 50μ, followed by drying. Suitable for the base film are thermal resistance films, examples of which include thermal resistance resin films such as polyimide films, polyvinylene sulfide films, polyether films, polyethylene terephthalate films, fluorine-based films, and composite thermal resistance films such as epoxy-glass cloth and epoxy-polyimide-glass cloth, with special preference to polyimide films. A preferable thickness of the thermal resistance film falls within the range of 5 to 150μ. Particularly where being used in adhesive tapes for LOC, there is usually employed a polyimide film 25μ or 50μ thick. In order to enhance the adhesive strength between the polyimide adhesive and the base film, a treatment with plasma, corona, or chemical agents, such as silane, is carried out on the base film. Also, the base film may be treated with a silicon-based releasing agent to produce an adhesive sheet comprising only a polyimide layer as an adhesive layer. For use, this releasable film ranges, in thickness, from 1 to 200μ.

By virtue of superiority in both thermal resistance and mechanical strength, the polyamic acid or polyimide prepared according to the present invention can be used as a material for thermal resistance films.

A better understanding of the present invention may be obtained in light of the following examples which are set forth to illustrate, but are not to be construed to limit the present invention.

EXAMPLE I

In a reaction vessel equipped with an agitator, a reflux condenser, and a nitrogen inlet, 173.07 g of N-methyl-2-pyrrolidone (NMP) as a solvent, 7.01 g (0.024 mol) of 1,4'-bis(4-aminophenoxy)biphenyl, 1.45 g (0.00585 mol) of bis(3-aminopropyl)tetramethyldisiloxane and 0.03 g (0.00015 mol) of 3,3',4,4'-tetraaminodiphenyl ether were first introduced and dissolved at 15° C., followed by the addition of 10.74 g (0.03 mol) of 3,3',4,4'-diphenylsulfone tetracarboxylic dianhydride. The resulting reaction solution was allowed to react for 5 hours in a nitrogen atmosphere with vigorous agitation to yield polyamic acid.

EXAMPLE II

In a reaction vessel equipped with an agitator, a reflux condenser, and a nitrogen inlet, 193.59 g of N-methyl-2-pyrrolidone (NMP) as a solvent, 10.37 g (0.024 mol) of 2,2-bis[4-(4-aminophenoxy)phenyl]sulfone, 1.45 g (0.00585 mol) of bis(3-aminopropyl)tetramethyldisiloxane and 0.03 g (0.00015 mol) of 3,3',4,4'-tetraaminodiphenyl ether were first introduced and dissolved at 15° C., followed by the addition of 9.66 g (0.03 mol) of 3,3',4,4'-benzophenone tetracarboxylic dianhydride. The resulting reaction solution was allowed to react for 5 hours in a nitrogen atmosphere with vigorous agitation to yield polyamic acid.

COMPARATIVE EXAMPLE I

In a reaction vessel equipped with an agitator, a reflux condenser, and a nitrogen inlet, containing 175.5 g of N-methyl-2-pyrrolidone (NMP) as a solvent, and 8.76 g (0.03 mol) of 1,3-bis(4-aminophenoxy)biphenyl was introduced and dissolved at 15° C., followed by the addition of 10.74 g (0.03 mol) of 3,3',4,4'-diphenylsulfone tetracarboxylic dianhydride. The resulting reaction solution was allowed to react for 5 hours in a nitrogen atmosphere with vigorous agitation to yield polyamic acid.

COMPARATIVE EXAMPLE II

In a reaction vessel equipped with an agitator, a reflux condenser, and a nitrogen inlet, containing 199.62 g of N-methyl-2-pyrrolidone (NMP) as a solvent, and 12.96 g (0.03 mol) of 2,2-bis[4-(4-aminophenoxy)phenyl]sulfone was first introduced and dissolved at 15° C., followed by the addition of 6.76 g (0.021 mol) of 3,3',4,4'-benzophenone tetracarboxylic dianhydride and 2.46 g (0.009 mol) of ethyleneglycol bis(anhydrotrimellitate). The resulting reaction solution was allowed to react for 5 hours in a nitrogen atmosphere with vigorous agitation to yield polyamic acid.

The polyamic acids prepared in Examples I and II and Comparative Examples I and II were measured for relative viscosity (polyamic acid was dissolved at a concentration of 0.05 wt % in N,N-dimethyl acetamide) and the results are given in Table 1, below.

Using a knife coater, the four kinds of polyamic acid varnishes obtained in the above Examples and Comparative Examples were coated on glass plates, respectively, followed by drying them for 60 min at 80° C. in a vacuum drier to produce films. After being peeled off from the glass plates, the films were dried at 150° C. for 5 min and further at 200° C. for 5 min, and finally subjected to thermal imidization at 300° C. for 1 hour to afford polyimide films 50μ thick. In IR spectra from the polyimides, absorption peaks were read at 1718 cm$^{-1}$ and 1783 cm$^{-1}$, which are typical for the imide group.

A measurement was made of the 5% weight loss temperature in air to examine the thermal resistance of the polyimide films. In accordance with the dynamic mechanical thermal analysis (DMTA) extension method, glass transition temperatures and storage modulus of the polyimide films are measured. The results are given in Table 1, below.

The above four kinds of polyamic acid varnishes were coated on Upilex-S films with the aid of a knife coater, and dried for ten min at 80° C., 110° C., 150° C. and 200° C., respectively, and finally subjected to thermal imidization for one hour at 300° C. to produce adhesive tapes, each having an adhesive layer 20μ thick. After being bonded onto a Cu plate, an NiFe alloy plate and a PIX-3000 (Hitachi Chemical Co.) coated plate at 400° C. at a pressure of 10 Kg/cm$^2$, the adhesive tapes were tested for the T-peel strength while they were pulled at a rate of 50 mm/min at room temperature. The results are also given in Table 1, below.

TABLE 1

| Nos. of Exmpl. | Relative Visco. $_{inh}$(dl/g) | Tg (°C.) | 5% Wt Loss Temp. | Storage Modulus at 25° C. | Storage Modulus at 230° C. | Active Strength (kg/cm) Cu | Active Strength (kg/cm) NiFe | PIX-3000 |
|---|---|---|---|---|---|---|---|---|
| I | 1.21 | 255 | 501 | $1.3 \times 10^{10}$ | $1.0 \times 10^{10}$ | 1.30 | 1.40 | 1.35 |
| II | 1.15 | 249 | 502 | $1.3 \times 10^{10}$ | $9.0 \times 10^{9}$ | 1.35 | 1.50 | 1.45 |
| C.I | 1.02 | 252 | 518 | $1.3 \times 10^{10}$ | $7.3 \times 10^{8}$ | 0.65 | 0.60 | 0.20 |
| C.II | 1.03 | 251 | 490 | $1.3 \times 10^{10}$ | $4.3 \times 10^{8}$ | 0.60 | 0.554 | 0.40 |

EXAMPLE III

In a reaction vessel equipped with an agitator, a reflux condenser, and a nitrogen inlet, 196.38 g of N-methyl-2-pyrrolidone (NMP) as a solvent, 7.01 g (0.024 mol) of 1,4-bis(4-aminophenoxy)benzene, 1.45 g (0.00585 mol) of bis(3-aminopropyl)tetramethyldisiloxane and 0.03 g (0.00015 mol) of 3,3',4,4'-tetraaminodiphenyl ether were first introduced and dissolved at 15° C., followed by the addition of 13.33 g (0.03 mol) of (3,4-dicarboxyphenyl)hexafluoropropane dianhydride. The resulting reaction solution was allowed to react for 5 hours in a nitrogen atmosphere with vigorous agitation to yield polyamic acid.

The polyamic acid was added with 50 ml of toluene and 3.0 g of p-toluene sulfonic acid and heated at 190° C., after which imidization was performed for 6 hours while moisture was removed from the reaction solution in dependence on the reaction progress. Thereafter, the polyimide solution was added to methanol for precipitation. The precipitates thus formed were separated, ground and dried to give polyimide powder. In IR spectra from the polyimides, absorption peaks were read at 1718 cm$^{-1}$ and 1783 cm$^{-1}$, which are typical for the imide group.

EXAMPLE IV

In a reaction vessel equipped with an agitator, a reflux condenser, and a nitrogen inlet, 221.85 g of N-methyl-2-pyrrolidone (NMP) as a solvent, 9.84 g (0.024 mol) of 2,2-bis[4-(4-aminophenoxy)phenyl]propane, 1.45 g (0.00585 mol) of bis(3-aminopropyl)tetramethyldisiloxane and 0.03 g (0.00015 mol) of 3,3',4,4'-tetraaminodiphenyl ether were first introduced and dissolved at 15° C., followed by the addition of 13.33 g (0.03 mol) of (3,4-dicarboxyphenyl)hexafluoropropane dianhydride. The resulting reaction solution was allowed to react for 5 hours in a nitrogen atmosphere with vigorous agitation to yield polyamic acid.

The polyamic acid was added to 50 ml of toluene and 3.0 g of p-toluene sulfonic acid and heated at 190° C., after which imidization was performed for 6 hours while moisture was removed from the reaction solution in dependence on the reaction progress. Thereafter, the polyimide solution was added to methanol for precipitation. The precipitates thus formed were separated, ground and dried to give polyimide powder. In IR spectra from the polyimides, absorption peaks were read at 1718 cm$^{-1}$ and 1783 cm$^{-1}$, which are typical for the imide group.

EXAMPLE VI

In a reaction vessel equipped with an agitator, a reflux condenser, and a nitrogen inlet, 147.33 g of N-methyl-2-pyrrolidone (NMP) as a solvent, 2.59 g (0.024 mol) of paraphenylene diamine, 1.45 g (0.00585 mol) of bis(3-aminopropyl)tetramethyldisiloxane and 0.03 g (0.00015 mol) of 3,3',4,4'-tetraaminodiphenyl ether were first introduced and dissolved at 15° C., followed by the addition of 12.3 g (0.03 mol) of ethyleneglycol bis(anhydrotrimellitate). The resulting reaction solution was allowed to react for 5 hours in a nitrogen atmosphere with vigorous agitation to yield polyamic acid.

The polyamic acid was added to 50 ml of toluene and 3.0 g of p-toluene sulfonic acid and heated at 190° C., after which imidization was performed for 6 hours while moisture was removed from the reaction solution in dependence on the reaction progress. Thereafter, the polyimide solution was added to methanol for precipitation. The precipitates thus formed were separated, ground and dried to give polyimide powder. In IR spectra from the polyimides, absorption peaks were read at 1718 cm$^{-1}$ and 1783 cm$^{-1}$, which are typical for the imide group.

COMPARATIVE EXAMPLE III

In a reaction vessel equipped with an agitator, a reflux condenser, and a nitrogen inlet, 198.81 g of N-methyl-2-pyrrolidone (NMP) as a solvent, and 8.76 g (0.03 mol) of 1,3-bis(4-aminophenoxy)benzene was introduced and dissolved at 15° C. The resulting reaction solution was allowed to react for 5 hours in a nitrogen atmosphere with vigorous agitation to yield polyamic acid.

The polyamic acid was added to 50 ml of toluene and 3.0 g of p-toluene sulfonic acid and heated at 190° C., after which imidization was performed for 6 hours while moisture was removed from the reaction solution in dependence on the reaction progress. Thereafter, the polyimide solution was added to methanol for precipitation. The precipitates thus formed were separated, ground and dried to give polyimide powder. In IR spectra from the polyimides, absorption peaks were read at 1718 cm$^{-1}$ and 1783 cm$^{-1}$, which are typical for the imide group.

COMPARATIVE EXAMPLE IV

In a reaction vessel equipped with an agitator, a reflux condenser, and a nitrogen inlet, 216.81 g of N-methyl-2-pyrrolidone (NMP) as a solvent, and 12.3 g (0.03 mol) of 2,2-bis[4-(4-aminophenoxy)phenyl]propane was first introduced and dissolved at 15° C., followed by the addition of 9.33 g (0.021 mol) of (3,4-dicarboxyphenyl)hexafluoropropane dianhydride and 2.46 g (0.009 mol) of ethyleneglycol bis(anhydrotrimellitate). The resulting reaction solution was allowed to react for 5 hours in a nitrogen atmosphere with vigorous agitation to yield polyamic acid.

The polyamic acid was added to 50 ml of toluene and 3.0 g of p-toluene sulfonic acid and heated at 190° C., after which imidization was performed for 6 hours while moisture was removed from the reaction solution in dependence on the reaction progress. Thereafter, the polyimide solution was added to methanol for precipitation. The precipitates thus formed were separated, ground and dried to give polyimide powder. In IR spectra from the polyimides, absorption peaks were read at 1718 cm$^{-1}$ and 1783 cm$^{-1}$, which are typical for the imide group.

COMPARATIVE EXAMPLE V

In a reaction vessel equipped with an agitator, a reflux condenser, and a nitrogen inlet, 156.69 g of N-methyl-2-pyrrolidone (NMP) as a solvent, 2.59 g (0.024 mol) of paraphenylenediamine and 2.21 g (0.006 mol) of 4,4-bis(4-aminophenoxy)biphenyl were first introduced and dissolved at 15° C., followed by the addition of 4.00 g (0.0009 mol) of 3,4-dicarboxyphenyl)hexafluoropropane dianhydride and 8.61 g (0.021 mol) of ethyleneglycol bis (anhydrotrimellitate). The resulting reaction solution was allowed to react for 5 hours in a nitrogen atmosphere with vigorous agitation to yield polyamic acid.

The polyamic acid was added to 50 ml of toluene and 3.0 g of p-toluene sulfonic acid and heated at 190° C., after which imidization was performed for 6 hours while moisture was removed from the reaction solution in dependence on the reaction progress. Thereafter, the polyimide solution was added to methanol for precipitation. The precipitates thus formed were separated, ground and dried to give polyimide powder. In IR spectra from the polyimides, absorption peaks were read at 1718 cm$^{-1}$ and 1783 cm$^{-1}$, which are typical for the imide group.

The polyamic acids prepared in Examples III to V and Comparative Examples III to V were measured for relative viscosity (polyamic acid was dissolved at a concentration of 0.05 wt % in N,N-dimethyl acetamide) and the results are given in Table 2, below.

Using a knife coater, the five kinds of polyamic acid varnished obtained in the above Examples and Comparative Examples were coated on glass plates, respectively, followed by drying for 60 min at 80° C. in a vacuum drier to produce films. After being peeled off the glass plates, the films were heated at 150° C. for 5 min, 200° C. for 5 min and at 300° C. for 10 min to afford polyimide films 50 m thick. In IR spectra from the polyimides, absorption peaks were read at 1718 cm$^{-1}$ and 1783 cm$^{-1}$, which are typical for the imide group.

A measurement was made of the 5% weight loss temperature in air to examine the thermal resistance of the polyimide films. In accordance with the dynamic mechanical thermal analysis (DMTA) extension method, glass transition temperatures and storage modulus of the polyimide films are measured. The results are given in Table 2, below.

The above five kinds of polyamic acid varnishes were coated on Upilex-S films with the aid of a knife coater, and dried for five min each at 100° C., 130° C., 150° C. and 200° C., respectively, and finally subjected to thermal imidization for 10 min at 300° C. to produce adhesive tapes, each having an adhesive layer 20 m thick. After being bonded onto a Cu plate, an NiFe alloy plate and a PIX-3000 (Hitachi Chemical Co.) coated plate at 400° C. at a pressure of 5 Kg/cm$^2$, the adhesive tapes were tested for the T-peel strength while they were pulled at a rate of 50 mm/min at room temperature. The results are also given in Table 2, below.

TABLE 2

| Nos. of Exmpl. | Relative Visco. $_{inh}$(dl/g) | Tg (° C.) | 5% Wt Loss Temp. | Storage Modulus at 25° C. | Storage Modulus at 230° C. | Active Strength (kg/cm) Cu | Active Strength (kg/cm) NiFe | Active Strength (kg/cm) PIX-3000 |
|---|---|---|---|---|---|---|---|---|
| III | 1.13 | 245 | 501 | 1.3 × 10$^{10}$ | 1.0 × 10$^{10}$ | 1.30 | 1.40 | 1.35 |
| IV | 1.17 | 249 | 502 | 1.2 × 10$^{10}$ | 9.0 × 10$^{10}$ | 1.35 | 1.50 | 1.45 |
| V | 1.33 | 252 | 495 | 1.2 × 10$^{10}$ | 1.0 × 10$^9$ | 1.10 | 1.20 | 1.20 |
| C.III | 1.12 | 248 | 518 | 1.3 × 10$^{10}$ | 7.3 × 10$^9$ | 0.65 | 0.60 | 0.20 |
| C.IV | 1.08 | 246 | 495 | 1.2 × 10$^{10}$ | 4.3 × 10$^8$ | 0.60 | 0.55 | 0.40 |
| C.V | 1.31 | 235 | 492 | 1.2 × 10$^{10}$ | 8.3 × 10$^9$ | 0.50 | 0.4 | 0.10 |

As apparent from the data obtained in the above Examples and Comparative Examples, the polyamic acid and polyimide prepared according to the present invention are superior in adhesive strength and high-temperature stability while maintaining their inherent thermal resistance and mechanical properties, and thus can be effectively used as an adhesive material for high temperature adhesive tapes suitable for semiconductor assembly.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method for the preparation of polyamic acid, which comprises reacting a mixture containing:

at least one tetracarboxylic dianhydride;

at least one aromatic diamine;

at least one diamine with a siloxane structure, represented by the following general formula I:

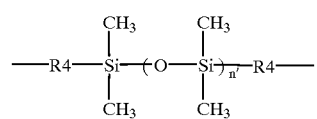

(I)

wherein R4 is an alkylene group containing 1–20 carbon atoms and n' is the number of a recurring unit from 1 to 20; and at least one polyamino compound represented by the following general formula II or III:

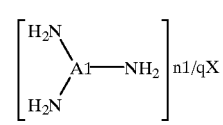

(II)

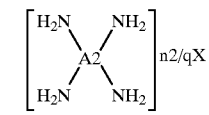

(III)

wherein A1 is selected from the group consisting of:

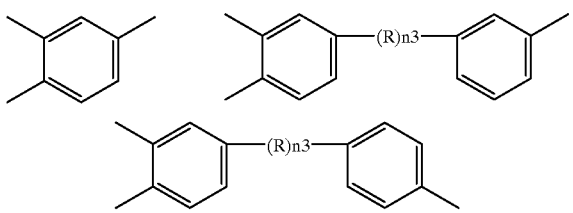

A2 is selected from the group consisting of:

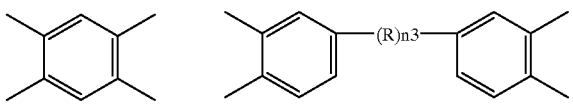

wherein R represents —O—, —CH$_2$—, —CO—, or —SO$_2$—;
n1 is an integer of 0 to 4; n2 is an integer of 0 to 3; n3 is 0 or 1; x represents an acid; and q is the base number of the acid.

2. A method for the preparation of polyimide, which comprises the steps of:

reacting a mixture containing at least one tetracarboxylic dianhydride; at least one aromatic diamine; at least one diamine with a siloxane structure, represented by the following general formula I:

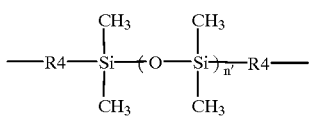 (I)

wherein R4 is an alkylene group containing 1–20 carbon atoms and n' is the number of a recurring unit from 1 to 20; and at least one polyamino compound represented by the following general formula II or III:

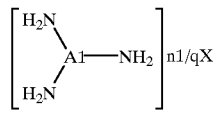 (II)

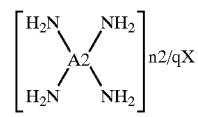 (III)

wherein A1 is selected from the group consisting of:

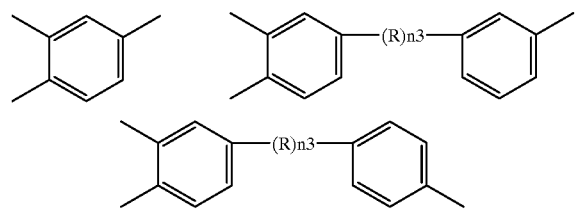

A2 is selected from the group consisting of:

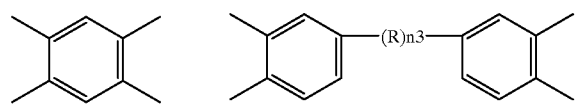

wherein R represents —O—, —CH$_2$—, —CO—, or —SO$_2$—;
n1 is an integer of 0 to 4; n2 is an integer of 0 to 3; n3 is 0 or 1; x represents an acid; and q is the base number of the acid, to give polyamic acid; and thermally or chemically imidizing the polyamic acid.

3. A method as claimed in claim 2, wherein the thermally imidizing step is carried out at 250–500° C.

4. A method as claimed in claim 1, wherein the aromatic diamine is used at an amount of 10 to 100 moles, the diamine compound with the siloxane structure of the general formula I at an amount of 0.1 to 90 moles, and the polyamino compound of the general formula II or III at an amount of 0.01–20 moles, based on 100 moles of the tetracarboxylic dianhydride.

5. A method as claimed in claim 2, wherein the aromatic diamine is used at an amount of 10 to 100 moles, the diamine compound with the siloxane structure of the general formula I at an amount of 0.1 to 90 moles, and the polyamino compound of the general formula II or III at an amount of 0.01–20 moles, based on 100 moles of the tetracarboxylic dianhydride.

* * * * *